(12) United States Patent
Garvin

(10) Patent No.: US 6,900,703 B2
(45) Date of Patent: May 31, 2005

(54) METHOD AND SYSTEM FOR ADJUSTING A FREQUENCY RANGE OF A DELAY CELL OF A VCO

(75) Inventor: Stacy J. Garvin, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 10/644,374

(22) Filed: Aug. 20, 2003

(65) Prior Publication Data

US 2005/0040898 A1 Feb. 24, 2005

(51) Int. Cl.[7] .................................................. H03B 5/24
(52) U.S. Cl. ........................ 331/183; 331/57; 331/177 R
(58) Field of Search ........................... 331/57, 109, 111, 331/116 R, 116 FE, 143, 177 R, 182, 183

(56) References Cited

U.S. PATENT DOCUMENTS

| | | |
|---|---|---|
| 5,426,398 A | 6/1995 | Kuo |
| 5,477,198 A | 12/1995 | Anderson et al. |
| 5,559,473 A | 9/1996 | Anderson et al. |
| 5,600,280 A * | 2/1997 | Zhang .................. 331/57 |
| 5,889,437 A | 3/1999 | Lee |
| 6,094,103 A | 7/2000 | Jeong et al. |

* cited by examiner

Primary Examiner—David Mis
(74) Attorney, Agent, or Firm—Sawyer Law Group LLP; Scott W. Reid

(57) ABSTRACT

The present invention describes aspects of adjusting a frequency range of a delay cell of a VCO. The aspects include providing a CMOS latch of predetermined gain, and altering transconductance in the CMOS latch to alter a frequency range of the CMOS latch without altering the predetermined gain. The alteration of transconductance includes coupling at least one pair of series connected transistors in parallel with each switching device of the CMOS latch.

16 Claims, 3 Drawing Sheets

METHOD AND SYSTEM FOR ADJUSTING A FREQUENCY RANGE OF A DELAY CELL OF A VCO

FIELD OF THE INVENTION

The present invention relates to voltage controlled oscillators (VCOs) and more particularly to VCO delay cells having an adjustable frequency range with essentially constant gain.

BACKGROUND OF THE INVENTION

Voltage controlled oscillators (VCOs) are commonly employed in phase-locked loops (PLLs) that often provide clock recovery functionality in serial link communications. As its name implies, a VCO provides an oscillating signal with a frequency that depends on a control voltage. The frequency range of the VCO, i.e., the range of possible output frequencies for a particular range of input voltages, is an important aspect of a VCO. The ability to achieve a greater frequency range of a VCO allows greater opportunity to support more frequency ranges in a single serial link. While increasing the gain increases the frequency range, a problem exists with a corresponding increase in the noise/jitter component as the gain increases. Delay cells of a VCO typically do not cover a large frequency range while maintaining low VCO gain. Conventional methods of covering double the frequency range include the use of switchable dividers on output phases and the use of current starved cells that allow variation in tail current. Unfortunately, these methods also have their drawbacks, including increased complexity of the switchable dividers approach and increased random jitter problems with the tail current approach.

Accordingly, a need exists for a VCO delay cell with an adjustable frequency range that maintains substantially constant gain and avoids the problems of random jitter increase and increased complexity. The present invention addresses such a need.

SUMMARY OF THE INVENTION

The present invention describes aspects of adjusting a frequency range of a delay cell of a VCO. The aspects include providing a CMOS latch of predetermined gain, and altering transconductance in the CMOS latch to alter a frequency range of the CMOS latch without altering the predetermined gain. The alteration of transconductance includes coupling at least one pair of series connected transistors in parallel with each switching device of the CMOS latch.

Through the present invention, minimization of random and deterministic jitter in a delay cell by maintaining low VCO gain is achieved while increasing the frequency range of the cell. Thus, the present invention provides a straightforward, effective, and efficient solution through enhancement of the features of a typical low noise cell to provide greater flexibility in selecting a frequency range achievable in the cell.

DESCRIPTION OF THE INVENTION

The present invention relates to adjusting a frequency range of a delay cell of a vco. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
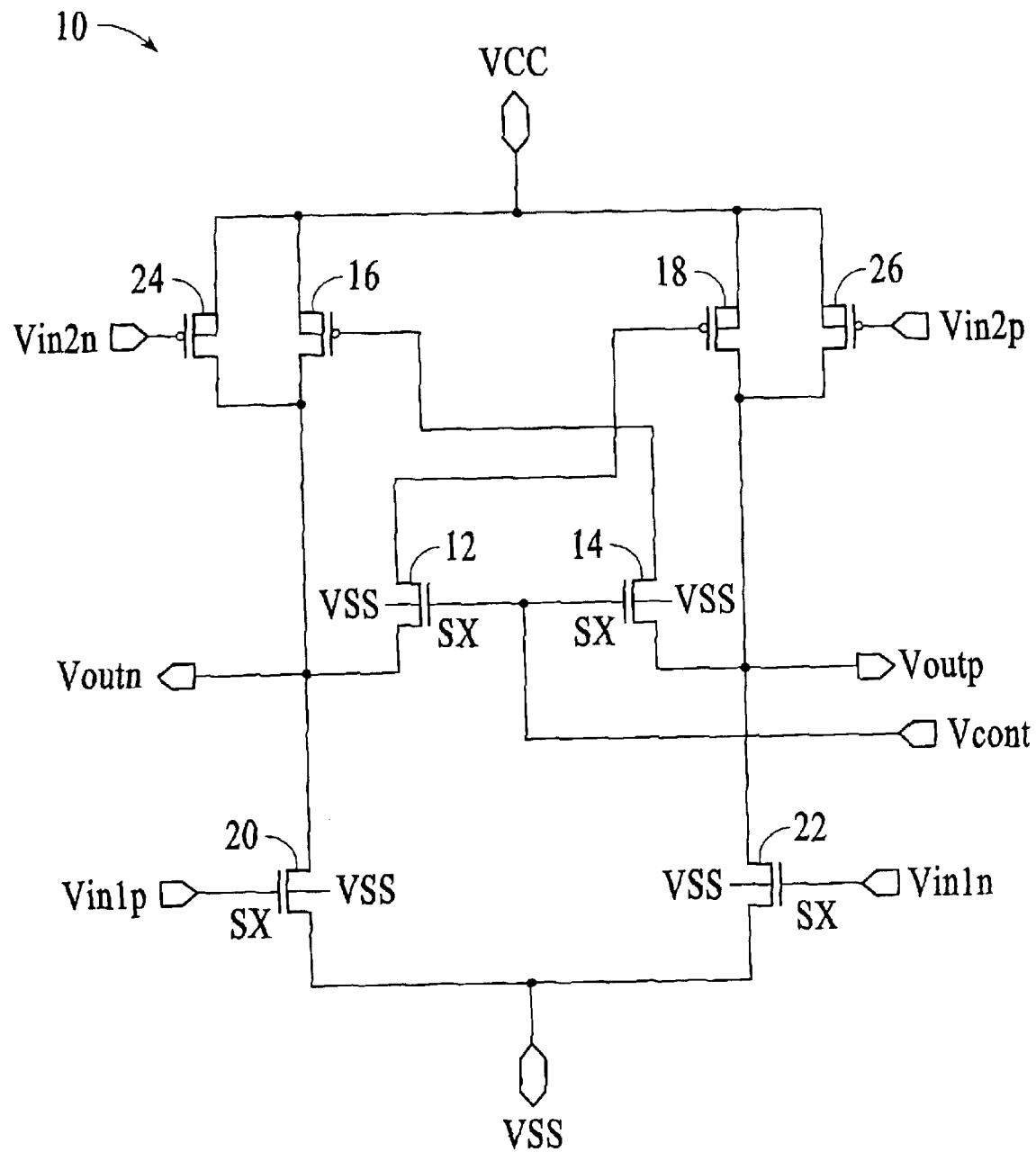
FIG. 1 illustrates a latch-type delay cell in accordance with the prior art.

FIG. 1 illustrates a latch-type delay cell 10 in accordance with the prior art for use in VCOs. The article, "A Low Noise, 900 MHz VCO in 0.6 um CMOS" by Park and Kim, *IEEE Journal of Solid-State Circuits*, May 1999, details the operation of the cell 10. In general, the latch-type delay cell 10 of FIG. 1 has a differential structure to reduce power-supply-injected phase noise and avoids the use of tail current source transistors. As described in the article and well-appreciated by those skilled in the art, the delay cell 10 includes a pair of cross-coupled NMOS transistors 12 and 14 that control a maximum gate voltage of PMOS load transistors 16 and 18 and limit the strength of the latch. Further coupled to NMOS transistors 12 and 14 and PMOS transistors 16 and 18 are NMOS transistors 20 and 22. In addition to transistors 12, 14, 16, 18, 20, and 22, which together basically form a simple differential inverter, the delay cell 10 includes PMOS transistors 24 and 26 coupled in parallel with PMOS transistors 16 and 18 in order to handle negative skewed delay signals.

Figure 2:
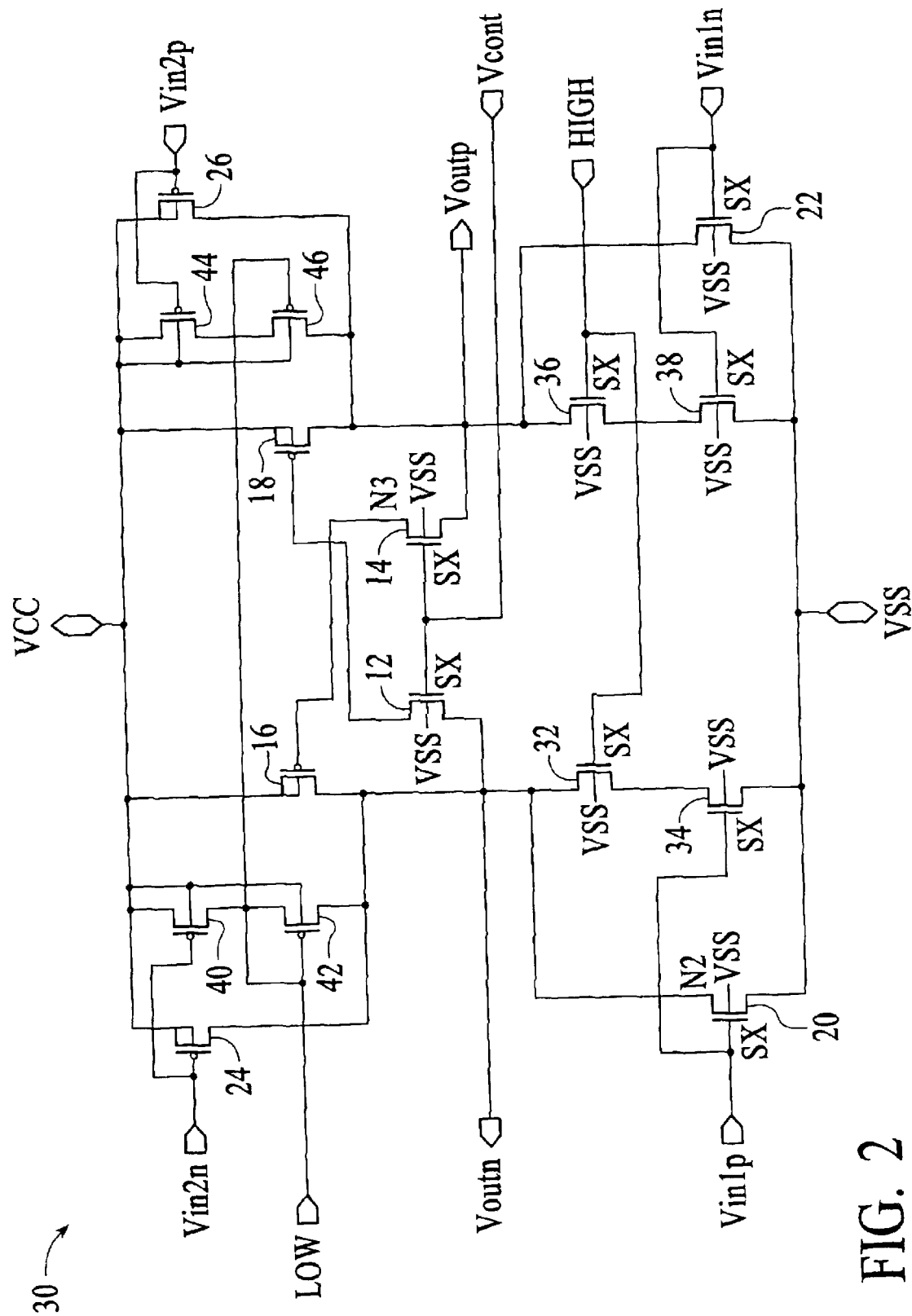
FIG. 2 illustrates a latch-type delay cell in accordance with the present invention.

With the benefit of low noise achieved in the cell 10, the present invention expands on the cell of FIG. 1 in order to allow greater adjustment to the frequency range of the cell while maintaining substantially constant gain. FIG. 2 illustrates a circuit diagram of a delay cell 30 in accordance with a preferred embodiment of the present invention that alters the frequency range by achieving a higher power setting to choose a higher frequency range. The delay cell 30 includes a pair of series connected transistors in parallel with each of the switching devices of the delay cell 10, i.e., transistors 20, 22, 24, and 26. As shown, NMOS transistors 32 and 34 are coupled in series to each other and in parallel with NMOS transistor 20; NMOS transistors 36 and 38 are coupled in series to each other and in parallel with NMOS transistor 22; PMOS transistors 40 and 42 are coupled in series to each other and in parallel with PMOS transistor 24; and PMOS transistors 44 and 46 are coupled in series to each other and in parallel with PMOS transistor 26. As is further shown, the transistor of the series connected pair that is closest to the supply voltage (34, 38, 40, 44) has its gate connected to the switching node, which aids in maintaining the delay in the cell, while the cascode transistor of the pair (32, 36, 42, 46) has its gate connected to the control signal (HIGH or LOW).

With this arrangement, when a given pair of series connected transistors is enabled, the connections allow for the parallel path to be turned on for the corresponding switching device. This essential increase in the size of the switching device effectively increase the transconductance of the cell and causes the circuit to switch faster. In operation, when more frequency is desired, the parallel path is active in each of the legs of the circuit. However, the control of the cell for the gain remains the same via the cross-coupled transistors in the cell. Thus, the frequency range of the cell is increased without increasing the gain and therefore without incurring increase in the jitter component. Of course, while a single pair of series connected transistors is shown in each leg, this is meant as illustrative and not restrictive of the number of pairs that may be included. Additional pairs may be included to further effectively increase the size of the cell and the frequency range, if desired, as is well appreciated by those skilled in the art.

Figure 3:
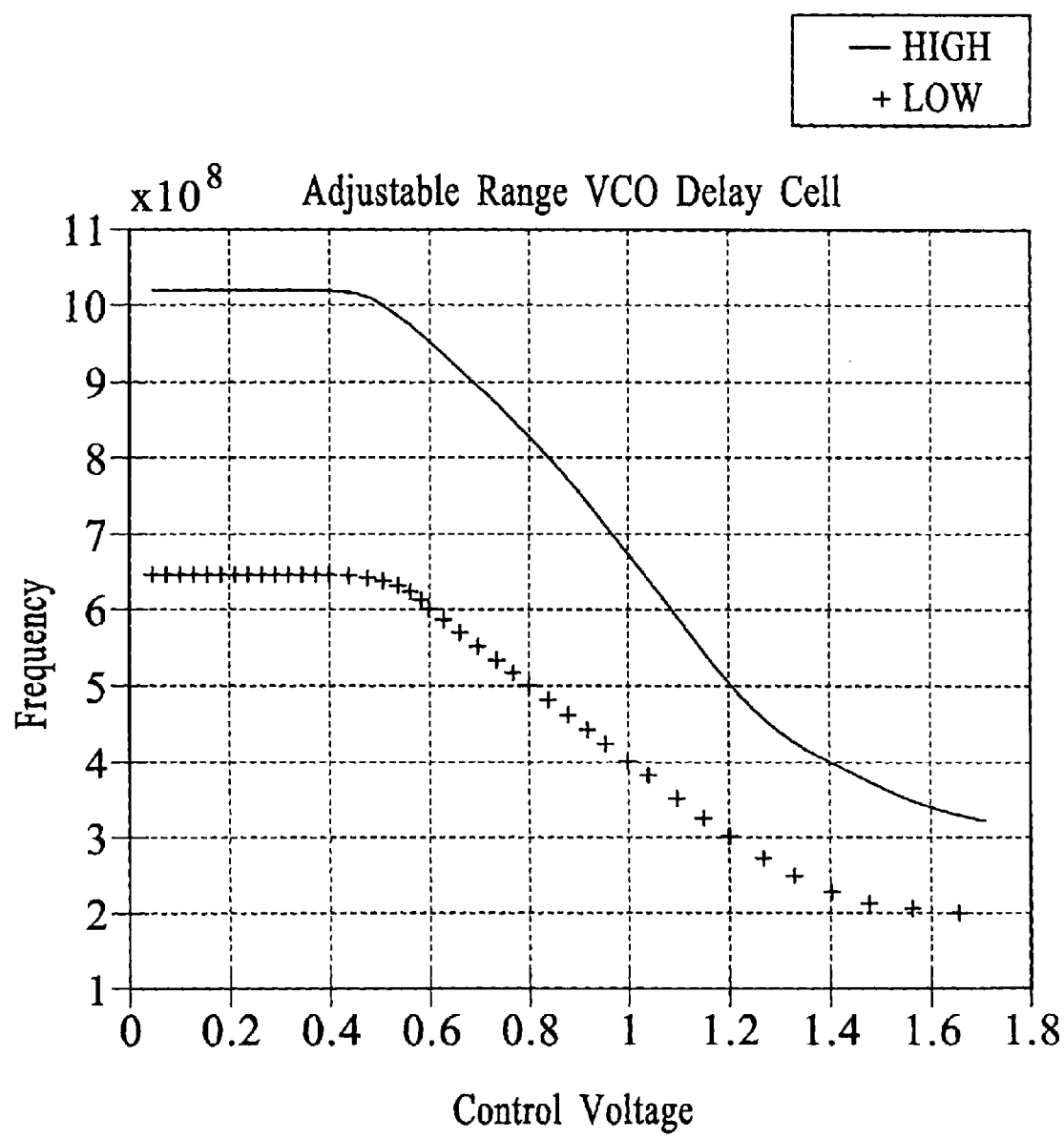
FIG. 3 illustrates a graph of frequency versus control voltage with data points from both HIGH and LOW control signal inputs for the circuit of FIG. 2.

FIG. 3 illustrates a graph of frequency versus control voltage with data points from both HIGH and LOW control signal inputs for the circuit of FIG. 2. The graph indicates an ability to achieve a shift in the frequency range without affecting the slope of the curve, i.e., the gain of the circuit. The lack of any increased gain maintains the low noise benefit of the cell.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for adjusting a frequency range of a delay cell of a VCO, the method comprising:
   providing a CMOS latch of predetermined gain; and
   altering transconductance in the CMOS latch to alter a frequency range of the CMOS latch without altering the predetermined gain.

2. The method of claim 1 wherein altering transconductance further comprises coupling at least one pair of series connected transistors in parallel with each switching device of the CMOS latch.

3. The method of claim 2 further comprising coupling a gate of one of the pair to a switching signal node of the CMOS latch and coupling a gate of the other of the pair to a control signal node of the CMOS latch.

4. The method of claim 2 wherein each switching device further comprises a transistor.

5. The method of claim 4 wherein the pair of series connected transistors comprise a matching transistor type and a same transistor type as the transistor switching device.

6. A system for adjusting a frequency range of a delay cell of a VCO, the system comprising:
   a CMOS latch of predetermined gain; and
   means for altering transconductance in the CMOS latch to alter a frequency range of the CMOS latch without altering the predetermined gain.

7. The system of claim 6 wherein the means for altering transconductance further comprises at least one pair of series connected transistors coupled in parallel with each switching device of the CMOS latch.

8. The system of claim 7 wherein a gate of one of the pair is coupled to a switching signal node of the CMOS latch and a gate of the other of the pair is coupled to a control signal node of the CMOS latch.

9. The system of claim 7 wherein each switching device further comprises a transistor.

10. The system of claim 9 wherein the pair of series connected transistors comprise a matching transistor type with the transistor.

11. A delay cell of variable frequency range with substantially constant gain for use in a VCO, the delay cell comprising:
    a CMOS latch including a plurality of switching devices; and
    at least one path of increased transconductance across each of the plurality of switching devices, wherein the CMOS latch switches faster while maintaining substantially constant gain.

12. The delay cell of claim 11 wherein each of the plurality of switching devices further comprises a switching device transistor.

13. The delay cell of claim 12 wherein the at least one path of increased transconductance further comprises at least one pair of transistors connected in series.

14. The delay cell of claim 13 wherein one of the at least one pair of transistors comprises a transistor with a gate coupled to a gate of the switching device transistor and another of the at least one pair of transistors comprises a transistor with a gate coupled to a control voltage.

15. The delay cell of claim 11 wherein the CMOS latch further comprises a cross-coupled pair of transistors to limit the gain of the CMOS latch.

16. The delay cell of claim 13 wherein each of the at least one pair of transistors comprises a matching transistor type to each other and to the switching device transistor.

* * * * *